… … …

United States Patent [19]
Levine

[11] 3,965,372

[45] June 22, 1976

[54] SIGNAL TRANSMISSION GATE

[75] Inventor: Morris E. Levine, Staten Island, N.Y.

[73] Assignee: Wagner Electric Corporation, Parsippany, N.J.

[22] Filed: Mar. 27, 1974

[21] Appl. No.: 455,065

[52] U.S. Cl. ............................ 307/254; 307/253; 307/255
[51] Int. Cl.² ...................................... H03K 17/60
[58] Field of Search ................... 307/253, 254, 255

[56] References Cited
UNITED STATES PATENTS

| | | | |
|---|---|---|---|
| 3,015,737 | 1/1962 | Harris et al. | 307/254 |
| 3,046,417 | 7/1962 | Garcia | 307/253 |
| 3,194,972 | 7/1965 | Buchmeyer | 307/255 |

Primary Examiner—R. V. Rolinec
Assistant Examiner—Lawrence J. Dahl
Attorney, Agent, or Firm—Eyre, Mann, Lucas & Just

[57] ABSTRACT

A signal transmission gate is disclosed for gating signals including those at af and rf frequencies in response to a gating signal. For the duration of the gating signal, the transmission gate has a low signal pass resistance. In the absence of a gating signal, the transmission gate has a high signal pass resistance. The transmission gate is bidirectional in that it can pass or block signals in two directions. The transmission gate is especially well-adapted for use in applications requiring a high signal shunt resistance when the transmission gate is on which is achieved by gating with a high impedance source. An embodiment of one such high impedance source is also disclosed.

12 Claims, 3 Drawing Figures

SIGNAL TRANSMISSION GATE

BACKGROUND OF THE INVENTION

The present invention relates to signal transmission gates. Generally, signal transmission gates should have a low signal pass resistance when gated on and a high signal pass resistance when gated off. Additionally, it may be desirable for the gate to have a high degree of signal isolation between the signal pass path and the gating source and ground.

SUMMARY OF THE INVENTION

The present invention is embodied in and carried out by a transistor operative when turned on to pass signals including those at af and rf frequencies with low loss and further operative when turned off to essentially block these signals. Thus, the transistor is a signal transmission gate. Using a bipolar transistor, the signal transmission gate is operative, when turned on, to pass signals in both directions, i.e., between the transistor collector and emitter electrodes and vice versa, and further operative when turned off to block signals in both directions. The transistor may be gated on by a gating signal applied between the base electrode and either the collector electrode or the emitter electrode. In applications requiring both the input and the output of the transmission gate, i.e., the collector and emitter electrodes to have a high degree of signal isolation from ground and/or the gating source, the base electrode is driven by a high impedance source. In applications in which either the input or output, i.e., either the collector or the emitter electrode, is grounded or connected to a low impedance, the base electrode may be driven by a low impedance source.

BRIEF DESCRIPTION OF THE DRAWING

The present invention will be more readily understood if the written description thereof is read in conjunction with the drawing, in which.

DESCRIPTION OF THE PREFERRED EMBODIMENTS

Figure 1:
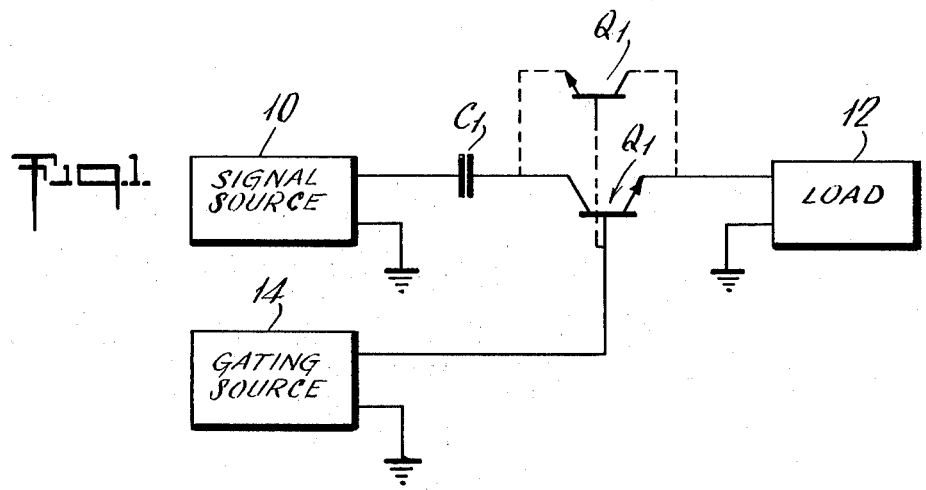
FIG. 1 shows schematically the signal transmission gate according to the invention.
Figure 2:
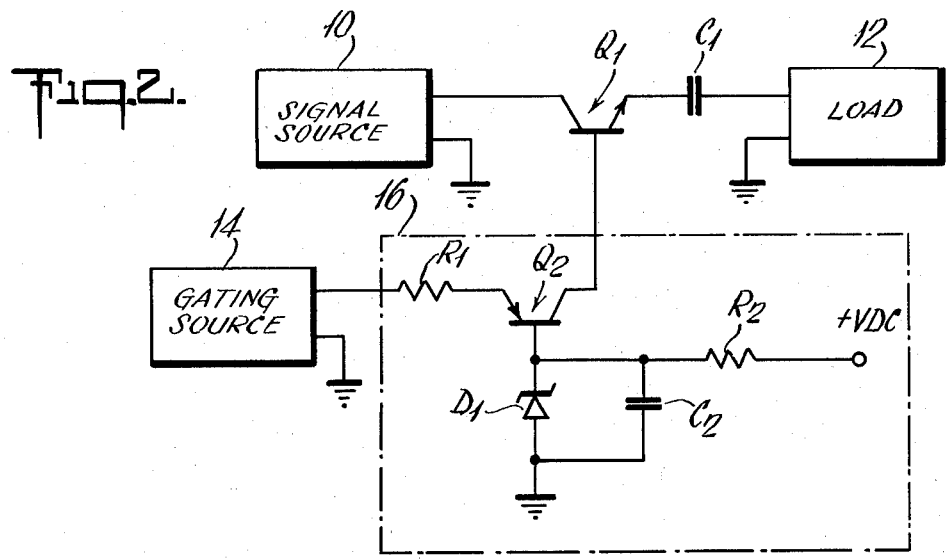
FIG. 2 shows schematically the signal transmission gate according to the invention utilized in an embodiment in which it is gated by a high impedance source.

Referring now to FIG. 1, a signal transmission gate made up of transistor Q1 is shown with signal source 10, which is capable of generating signals at af and/or rf frequencies, connected to its collector electrode through capacitor C1, a load 12 connected to its emitter electrode, and a gating source 14 connected to its base electrode. Operation is as follows. With a zero or negative gating signal applied between the base and the emitter of transistor Q1, transistor Q1 is off and provides an essentially open circuit in both directions between signal source 10 and load 12, as well as between the signal source and load and gating source 14. When a sufficiently positive gating signal is applied between the base and emitter of transistor Q1, Q1 is turned on to provide a low signal impedance between signal source 10 and load 12. The magnitude of the series signal impedance is determined by the degree to which transistor Q1 is turned on. Capacitor C1 merely blocks the flow of DC current between the signal source 10 and load 12, and gating source 14. Because of the bipolar nature of junction transistors, which is seldom if ever appreciated, when Q1 is gated on, it is capable of passing signal current in either direction between its collector and emitter. Therefore, the emitter and collector electrodes of transistor Q1 may be interchanged as shown in phantom FIG. 1. The DC path from the gating source 14 to ground is completed through the emitter of transistor Q1 and the load 12. One such DC path is required to turn transistor Q1 on and may, surprisingly, be from the gating source 14 through the collector of transistor Q1 and the signal source, as shown in FIG. 2. In other words, capacitor C1 may be connected either to the collector or emitter of transistor Q1 or omitted depending on DC considerations in the load or signal source. Alternatively, a separate DC path could be provided by connection of an independent ground path directly to the emitter or collector of transistor Q1.

Referring now to FIG. 2, the embodiment of FIG. 1 is shown with a specific gating circuit 16 interposed between the gating source 14 and the base of transistor Q1. The base of Q1 is driven through a high signal impedance provided by the common base amplifier arrangement of transistor Q2. A high signal impedance at the base of transistor Q1 is required when both the collector and emitter of transistor Q1 must be maintained at a high signal impedance with respect to ground because of the nature of signal source 10 or load 12, or both. In FIG. 2, load 12 presents a high signal impedance to the emitter of Q1 through capacitor C1. When transistor Q1 is turned on, its base and emitter are essentially at the same potential. Therefore, in order to avoid shunting the load, the base of transistor Q1 must also be at a high impedance with respect to ground. Gating circuit 16 accomplishes this by employing a transistor Q2 connected in the common base amplifier configuration to provide a high signal impedance between collector and base of Q2. Connected to the base of transistor Q2 is a low gating signal impedance bias circuit including zener diode D1, capacitor C2 and resistor R2. This bias circuit places the base of transistor Q2 at gating signal ground potential in order that transistor Q2 may operate efficiently as a grounded base amplifier with its base voltage more positive with respect to its collector voltage. A positive DC voltage is applied to resistor R2 to effect and maintain break-down of zener diode Dl. Thus, a constant bias voltage is applied to the base of transistor Q2. The gating signal in the form of a positive voltage is applied to the emitter of transistor Q2 through resistor R1. When the gating signal voltage at the emitter sufficiently exceeds the bias voltage at the base, transistor Q2 (PNP) is turned on to provide base current to transistor Q1 (NPN) to turn Q1 on. As mentioned hereinabove, capacitor C1 merely blocks DC between load 12, Q1 and Q2. Hence, transistor Q1 is turned on by a DC path through signal source 10. Of course, if no DC blocking is required, C1 may be eliminated completely. Capacitor C2 if required across zener diode D1 reduces the gating signal impedance at the base of transistor Q2.

Figure 3:
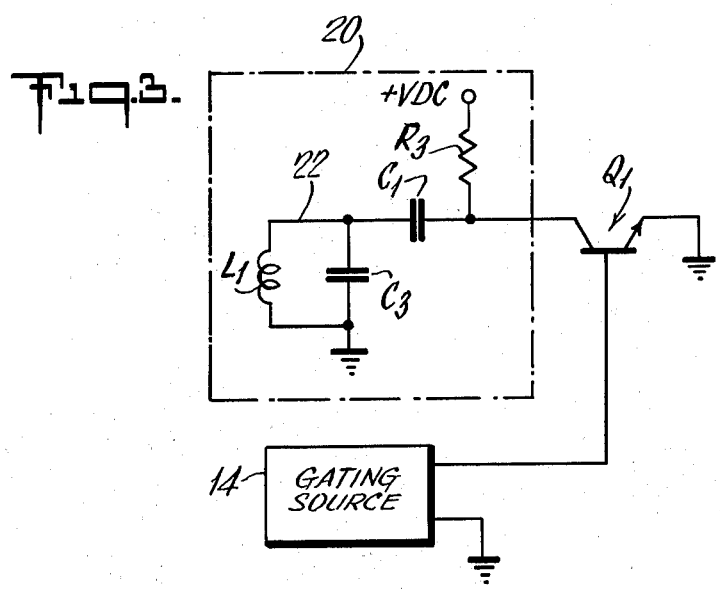
FIG. 3 shows schematically the signal transmission gate according to the invention used in embodiment in which it may be gated by a low impedance source.

Referring now to FIG. 3, the signal transmission gate comprising transistor Q1 is shown connected to a signal source 20 wherein the signal source is gated through Q1 to ground. As described hereinabove, where it is not necessary to maintain the emitter at a high impedance with respect to ground, transistor Q1 may be driven by a low impedance source. Thus, the gating circuit 16 of FIG. 2 is not required in FIG. 3 and transistor Q1 may be driven from a gating source 14 having a low impedance. Signal source 20 includes an energy storing circuit 22 made up of the parallel connection to ground of inductor L1 and capacitor C3. Energy is supplied to circuit 22 by a positive DC voltage source through capacitor C1 and resistor R3. Selectively energizing and de-energizing circuit 22 generates energizing and de-energizing signals, with the concurrent effect of changing the signal impedance of that circuit. By capacitively coupling the collector of transistor Q1 to circuit 22 through capacitor C1, circuit 22 may be de-energized and energized by gating transistor Q1 on and off to thereby effectively gate the de-energizing signal from circuit 22 to ground and the energizing signal from the positive DC source to circuit 22. Gating transistor Q1 on and off also changes the impedance at circuit 22.

In the preferred embodiments of the invention shown in the drawing and described above, the values and/or characteristics of the various circuit components are set forth below:

| Resistances (ohms) | Capacitances |
| --- | --- |
| R1 2.2K | C1 0.001 µf |
| R2 10K | C2 0.027 µf |
| R3 100K | C3 50 pf |
| Inductors | Zener Diodes |
| L1 39 µh | D1 1N 5230 |
| Transistors | |
| Q1 2N 5135 | |
| Q2 2N 5138 | |

The advantages of the present invention, as well as certain changes and modifications of the disclosed embodiments thereof, will be readily apparent to those skilled in the art.

For example, in FIG. 2, for operation from a negative power supply, PNP transistors are substituted for NPN transistors and vice versa, with the connections of the zener diode being reversed. Similarly, in FIG. 3, an NPN transistor is substituted. Of course, the proper polarity of the gating signal must be applied in all configurations. Additionally, the series signal resistance of the disclosed embodiments may be decreased by connecting one or more transistors in parallel to transistor Q1, i.e., by connecting the base(s) of the additional transistor(s) to the base of Q1, the emitter(s) to the emitter of Q1, and the collector(s) to the collector of Q1 or by any of the well known multiple transistor combinations such as the Darlington pair. The series signal resistance may be increased by connecting one or more transistors in series with transistor Q1, i.e., by connecting the emitter of Q1 to the emitter of a second transistor, the collector of the second transistor to the load, or if there are more transistors to the emitter of a third, etc., and finally the emitter of the last transistor to the load, and the base of Q1 to the base(s) of the additional transistor(s). It should be realized, however, that these two methods of increased performance are mutually exclusive. Although the invention has been described with reference to specified types of transistors, other types may be substituted without departing from the spirit and scope of the invention. For example field-effect transistors (FET's) may also be employed to pass and block signals as described hereinabove. Of course, when substituting different types of transistors, the bias considerations and particular connections of the transistor will have to be considered. For example, an FET will pass or block signals between its drain and source electrodes, in both directions when the proper gating signal is applied to the FET gate electrode. It is the applicant's intention to cover all those changes and modifications which could be made to the embodiments of the invention herein chosen for the purposes of the disclosure without departing from the spirit and scope of the invention.

What is claimed is:

1. A bilateral signal transmission gate circuit for bilaterally transmitting and blocking signals of a frequency at least as high as audio frequency comprising DC blocking means, a first bipolar transistor and shunt impedance increasing means connected to said first bipolar transistor's base electrode operative to couple with a high impedance a gating signal to said base electrode, said first bipolar transistor being operative, when gated on by said gating signal, to bilaterally provide a low signal impedance through said DC blocking means between its emitter and collector electrodes and, when off, to bilaterally provide a high signal impedance therebetween, said shunt impedance increasing means being operative to increase the shunt signal impedance between said first bipolar transistor collector and emitter electrodes and ground.

2. A signal transmission gate circuit according to claim 1 wherein said first bipolar transistor collector electrode is connected to said DC blocking means.

3. A signal transmission gate according to claim 1 wherein said first bipolar transistor emitter electrode is connected to said DC blocking means.

4. A signal transmission gate circuit according to claim 1 wherein a load is connected to said bipolar transistor emitter electrode through said DC blocking means.

5. A signal transmission gate circuit according to claim 1 wherein a source for said signal is connected to said first bipolar transistor collector electrode through said DC blocking means.

6. A signal transmission gate circuit according to claim 1 wherein said shunt impedance increasing means comprises a common base amplifier.

7. A signal transmission gate circuit according to claim 6 wherein said common base amplifier comprises a second transistor, the collector of which is connected to the base of said first bipolar transistor, the base of which is connected to bias means, and the emitter of which is connected to means for generating a gating signal.

8. A signal transmission gate circuit according to claim 5 wherein said source comprises an energy storing circuit connected to a source of electrical power.

9. A signal transmission gate circuit according to claim 8 wherein said energy storing circuit comprises an inductance and a second capacitance connected in parallel.

10. A signal transmission gate circuit according to claim 9 wherein said first bipolar transistor when gated on is operative to change the energization level of said energy storing circuit by shunting said source of electrical power and said energy storing circuit through said first bipolar transistor collector and emitter electrodes.

11. A signal transmission gate circuit according to claim 10, wherein a load is connected to said first bipolar transistor emitter electrode.

12. A signal transmission gate circuit according to claim 11, wherein the load is replaced by a short circuit to ground.

* * * * *